United States Patent
Yang et al.

(10) Patent No.: US 10,026,539 B2
(45) Date of Patent: Jul. 17, 2018

(54) THIN FILM TYPE COIL COMPONENT AND METHOD OF MANUFACTURING THE SAME

(71) Applicant: SAMSUNG ELECTRO-MECHANICS CO., LTD., Suwon-Si, Gyeonggi-Do (KR)

(72) Inventors: Ju Hwan Yang, Suwon-Si (KR); Young Seuck Yoo, Suwon-Si (KR); Jae Yeol Choi, Suwon-Si (KR); Jong Bong Lim, Suwon-Si (KR)

(73) Assignee: SAMSUNG ELECTRO-MECHANICS CO., LTD., Suwon-si, Gyeonggi-Do (KR)

( * ) Notice: Subject to any disclaimer, the term of this patent is extended or adjusted under 35 U.S.C. 154(b) by 122 days.

(21) Appl. No.: 14/989,713

(22) Filed: Jan. 6, 2016

(65) Prior Publication Data
US 2017/0004917 A1   Jan. 5, 2017

(30) Foreign Application Priority Data
Jun. 30, 2015 (KR) .................. 10-2015-0093569

(51) Int. Cl.
| | |
|---|---|
| *H01F 5/00* | (2006.01) |
| *H01F 27/28* | (2006.01) |
| *H01F 41/04* | (2006.01) |
| *C23F 1/18* | (2006.01) |
| *C23F 1/28* | (2006.01) |
| *C23F 1/30* | (2006.01) |
| *C25D 3/12* | (2006.01) |
| *C25D 5/34* | (2006.01) |
| *C25D 5/48* | (2006.01) |
| *C25D 7/00* | (2006.01) |

(Continued)

(52) U.S. Cl.
CPC ......... *H01F 27/2804* (2013.01); *C23C 14/34* (2013.01); *C23F 1/02* (2013.01); *C23F 1/18* (2013.01); *C23F 1/28* (2013.01); *C23F 1/30* (2013.01); *C25D 3/12* (2013.01); *C25D 5/022* (2013.01); *C25D 5/34* (2013.01); *C25D 5/48* (2013.01); *C25D 7/00* (2013.01); *C25D 7/001* (2013.01); *H01F 17/0013* (2013.01); *H01F 41/042* (2013.01); *H01F 2027/2809* (2013.01)

(58) Field of Classification Search
CPC ..................... H01F 27/2804; H01F 2027/2809
USPC .................... 336/200, 232, 234; 257/531
See application file for complete search history.

(56) References Cited

U.S. PATENT DOCUMENTS

| | | | | |
|---|---|---|---|---|
| 6,600,404 B1 * | 7/2003 | Kajino | ............. | H01F 5/003 |
| | | | | 257/531 |
| 7,307,503 B2 * | 12/2007 | Kaji | ............. | H01F 17/0006 |
| | | | | 257/E21.022 |

(Continued)

FOREIGN PATENT DOCUMENTS

| | | |
|---|---|---|
| JP | 2006-332147 A | 12/2006 |
| KR | 10-2013-0104808 A | 9/2013 |

*Primary Examiner* — Elvin G Enad
*Assistant Examiner* — Kazi Hossain
(74) *Attorney, Agent, or Firm* — McDermott Will & Emery LLP

(57) ABSTRACT

A thin film type coil component including coil patterns in a cross section shape having an undercut in lower portions thereof is provided. The coil patterns may reduce parasitic capacitance between the coil patterns, thereby minimizing electrical loss. The volume of the coil patterns may be increased, thereby improving inductance and resistance characteristics.

9 Claims, 5 Drawing Sheets

(51) Int. Cl.
C23C 14/34 (2006.01)
C25D 5/02 (2006.01)
H01F 17/00 (2006.01)
C23F 1/02 (2006.01)

(56) References Cited

U.S. PATENT DOCUMENTS

| | | | |
|---|---|---|---|
| 7,397,334 B2 | 7/2008 | Yoshida et al. | |
| 7,460,000 B2* | 12/2008 | Kudo | H01F 17/0013 336/200 |
| 2001/0024739 A1* | 9/2001 | Mizoguchi | H01F 17/0006 428/606 |
| 2005/0184848 A1* | 8/2005 | Yoshida | H01F 17/0013 336/223 |
| 2006/0220776 A1* | 10/2006 | Fujiwara | H01F 17/0006 336/200 |
| 2007/0205856 A1* | 9/2007 | Matsunaga | H01F 17/0013 336/200 |
| 2007/0222550 A1* | 9/2007 | Fujiwara | H01F 17/0033 336/200 |
| 2013/0241684 A1 | 9/2013 | Yang et al. | |
| 2014/0167897 A1* | 6/2014 | Choi | H01F 27/255 336/83 |
| 2014/0333407 A1* | 11/2014 | Otsubo | H01F 17/0013 336/200 |
| 2015/0091688 A1* | 4/2015 | Jung | H01F 17/0006 336/200 |

* cited by examiner

VIEW A-A

THIN FILM TYPE COIL COMPONENT AND METHOD OF MANUFACTURING THE SAME

CROSS-REFERENCE TO RELATED APPLICATION

This application claims benefit of priority to Korean Patent Application No. 10-2015-0093569 filed on Jun. 30, 2015 with the Korean Intellectual Property Office, the disclosure of which is incorporated herein by reference.

TECHNICAL FIELD

The present disclosure relates to a thin film type coil component and a method of manufacturing the same.

BACKGROUND

A thin film type coil component is an electronic component used to remove noise from various electronic devices.

As electronic products have recently been developed to be compact, thin, and to have multiple functions, a thin film type coil component that improves a noise removal function and is simultaneously compact and with thin film has been developed.

A volume occupied by a coil pattern is required to be increased in order to improve characteristics of the thin film type coil component such as inductance and direct current resistance.

In general, the coil pattern is formed using a photolithography method. When a photoresist pattern is formed, narrowing a width of a pattern or spaces between adjacent patterns is limited. Due to the limitations of the photolithography method, narrowing spaces between adjacent coil patterns is limited.

Electrical loss of a thin film type coil component including a plurality of coil patterns may increase due to parasitic capacitance of adjacent coil patterns. This is determined by an area in which adjacent coil patterns are in contact with each other. The smaller the contact area, the lower the parasitic capacitance.

Therefore, a manufacturing method of increasing the volume of coil patterns while maintaining spaces between adjacent coil patterns is important. It is also important to obtain a thin film type coil component capable of reducing parasitic capacitance that occurs between coil patterns.

SUMMARY

An exemplary embodiment in the present disclosure may provide a thin film type coil component which can reduce parasitic capacitance that occurs between coil patterns and improve inductance and resistance characteristics.

According to an exemplary embodiment in the present disclosure, the volume of coil patterns of a thin film type coil component is increased, and areas of upper and lower cross-sections of the coil patterns are differentiated, thereby improving inductance and resistance characteristics and simultaneously reducing parasitic capacitance between the coil patterns.

BRIEF DESCRIPTION OF DRAWINGS

The above and other aspects, features, and advantages in the present disclosure will be more clearly understood from the following detailed description taken in conjunction with the accompanying drawings, in which.

DETAILED DESCRIPTION

Figure 1:
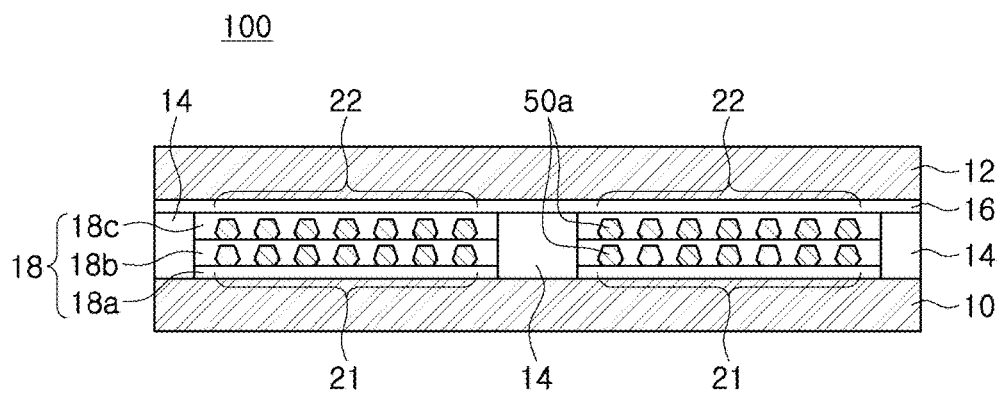
FIG. 1 is a schematic cross-sectional view of a thin film type coil component according to an exemplary embodiment in the present disclosure.

Hereinafter, embodiments of the present disclosure will be described in detail with reference to the accompanying drawings.

The disclosure may, however, be embodied in many different forms and should not be construed as being limited to the embodiments set forth herein. Rather, these embodiments are provided so that this disclosure will be thorough and complete, and will fully convey the scope of the disclosure to those skilled in the art.

In the drawings, the shapes and dimensions of elements may be exaggerated for clarity, and the same reference numerals will be used throughout to designate the same or like elements.

Figure 2:
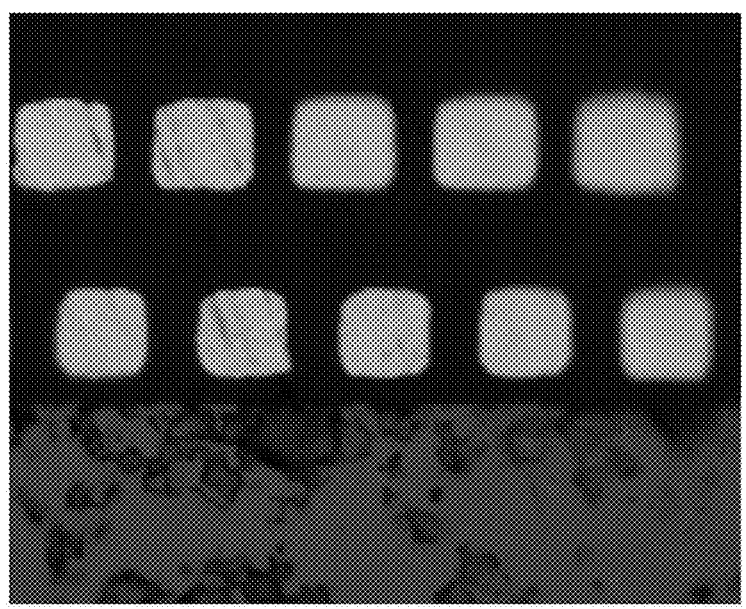
FIG. 2 is a photo of a cross-section of a coil pattern observed by an optical microscope according to an exemplary embodiment in the present disclosure.

FIG. 1 is a schematic cross-sectional view of a thin film type coil component 100 according to an exemplary embodiment. FIG. 2 is a photo of a cross-section of a coil pattern observed by an optical microscope according to an exemplary embodiment.

Referring to FIG. 1, the thin film type coil component 100 according to an exemplary embodiment may include a first substrate 10 and first and second coils 21 and 22 provided on the first substrate 10. Each of the first and second coils 21 and 22 includes a plurality of coil patterns 50a formed on a same plane. Thus, the first and second coils 21 and 22 are planner coils A cross-section of each coil pattern 50a may satisfy a shape that at least one region among inner regions located between upper and lower cross sections is greater than widths of the upper and lower cross sections.

The first substrate 10 may be a magnetic substrate, and an insulating layer 18 may be disposed on the first substrate 10.

In more detail, the thin film type coil component 100 may have a structure in which a first insulating layer 18a, a second insulating layer 18b provided on the first insulating layer 18a, the first coil 21 formed in the second insulating layer 18b, a third insulating layer 18c provided on the second insulating layer 18b, and the second coil 22 formed in the third insulating layer 18c are sequentially stacked on the first substrate 10. The thin film type coil component 100 may include an adhesive layer 16 provided on the stacked first and second coils 21 and 22, and a second substrate 12 provided on the adhesive layer 16. A magnetic layer 14 may be formed on end portions of the first and second coils 21 and 22.

The insulating layer 18 may be a polyimide or epoxy resin.

The first and second coils 21 and 22 may be formed on the first substrate 10 and may include at least one of gold, silver, platinum, copper, nickel, and palladium, or alloys thereof.

The first and second coils 21 and 22 may be formed of conductive materials that are not limited to the metal described above.

The cross-section of the coil pattern 50a may have a shape including the upper and lower cross-sections and one region disposed between the upper and lower cross-sections in a stack direction.

The first substrate 10 formed of a magnetic material may contain an iron (Fe) factor. In this regard, when coils have very narrow spaces, an electric connection phenomenon may be induced due to the factor such as iron.

The thin film type coil component 100 may include the first insulating layer 18a disposed between the first substrate 10 and the first coil 21. The first insulating layer 18a may insulate the first substrate 10 and the first coil 21.

Figure 3:
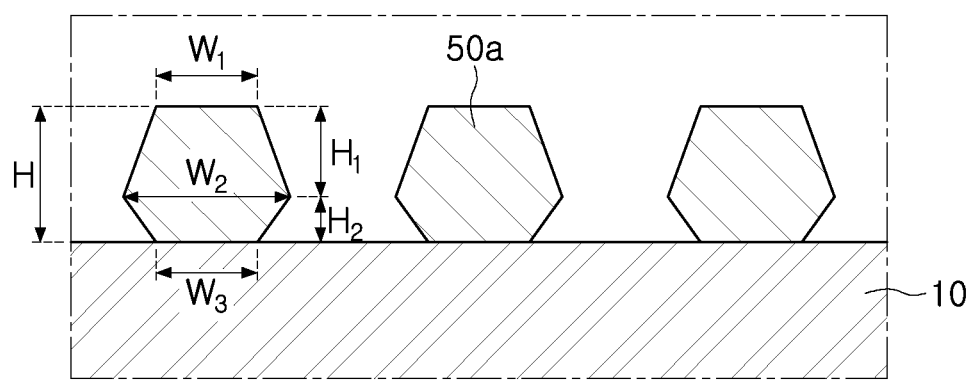
FIG. 3 is a cross-sectional view of a coil pattern of a thin film type coil component according to an exemplary embodiment in the present disclosure and is an enlarged view of region A of FIG. 4F.

FIG. 3 is a cross-sectional view of the coil pattern 50a of the thin film type coil component 100 according to an exemplary embodiment.

Referring to FIG. 3, the coil pattern 50a may satisfy a shape that at least one region among inner regions located between upper and lower cross sections has a width W2 greater than widths W1 and W3 of the upper and lower cross sections. In other words, the width of coil pattern 50a first increases from W1 to W2 and then decreases from W2 to W3 in a vertical direction of the cross-section view towards the substrate 10. Here, the vertical direction refers to a direction perpendicular to the substrate 10.

When the at least one region is greater than the widths of the upper and lower cross sections in the coil pattern 50a, inductance and resistance characteristics of the thin film type coil component 100 may be improved by increasing the volume of the coil pattern 50a.

In a thin film type coil component in which a plurality of coil patterns are stacked on one another, parasitic capacitance may occur between vertically adjacent coil patterns. In this regard, if an area corresponding to the adjacent coil patterns is reduced, the parasitic capacitance may be reduced.

The width W1 of the upper cross section of the coil pattern 50a of the thin film type coil component 100 of the exemplary embodiment may be narrower than the width W3 of the lower cross section thereof, and thus the parasitic capacitance that occurs between coil patterns may be reduced, thereby reducing electrical loss of the thin film type coil component 100.

If an area of a lower portion of the coil pattern 50a that is in contact with the first substrate 10 is very narrow, the first substrate 10 may be separated from the coil pattern 50a, which may deteriorate reliability of the thin film type coil component 100. If an area of the lower cross section of the coil pattern 50a is very wide, there may be a problem that the cross section and volume of the coil pattern 50a are significantly reduced.

Therefore, the cross section of the coil pattern 50a may satisfy the shape that the at least one region among inner regions located between upper and lower cross sections is greater than the widths of the upper and lower cross sections, thereby reducing parasitic capacitance and improving inductance and resistance characteristics.

The cross section of the coil pattern 50a may be H1>H2 when a height from the upper cross section of the coil pattern 50a to the one region is H1 and a height from the lower cross section thereof to the one region is H2.

The one region of the coil pattern 50a may be disposed at a position where an entire thickness H of coil patterns is separated into H1 and H2.

Referring to FIG. 3, the cross section of the coil pattern 50a may have a double trapezoidal shape in which an undercut is formed in the lower cross section. The double trapezoidal shape refers to two trapezoids stacking on one another sharing a same base which is longer than any bases parallel to the shared base. The shared base of the double trapezoidal shape has the largest width W2 than any other portion of the cross section of the coil pattern 50a.

The undercut may be a groove formed of one side in the conductive pattern by side etching.

Adjacent coil patterns need to maintain a minimum spaced distance in order to secure insulation. The smaller the spaced distances between the coil patterns, the greater the volume of the coil patterns.

Therefore, an interval between adjacent coil patterns 50a may be in the range from about 0.15 to about 0.45 times the width of the one region. The shape of the cross section of the coil pattern 50a may be formed within the scope satisfying the above-mentioned range.

A method of manufacturing the thin film type coil component 100 according to the exemplary embodiment will now be described below.

FIGS. 4A through 4F are schematic cross-sectional views for describing a method of manufacturing the thin film type coil component 100 according to an exemplary embodiment. FIG. 3 is an enlarged view of a region A of FIG. 4F.

As shown in FIGS. 4A through 4F, the method of manufacturing the thin film type coil component 100 according to the exemplary embodiment may include an operation of forming a metal seed layer 20 on a surface of the first substrate 10, an operation of forming photoresist patterns 30 on the metal seed layer 20, an operation of plating metal on a surface of the metal seed layer 20 exposed by the photoresist patterns 30 to form a conductive member 40, an operation of removing the photoresist patterns 30 to expose temporary metal patterns 40 and 41, and an operation of forming the coil patterns 50a by etching the temporary metal patterns 40 and 41.

Figure 4A:
FIGS. 4A through 4F are schematic cross-sectional views for describing a method of manufacturing a thin film type coil component according to an exemplary embodiment in the present disclosure.
Figure 4B:

First, referring to FIGS. 4A and 4B, the metal seed layer 20 may be formed on the surface of the first substrate 10.

The first substrate 10 may be a magnetic substrate. The metal seed layer 20 may be formed on the surface of the first substrate 10 by sputtering a seed material for performing a subsequent plating process.

Figure 4C:
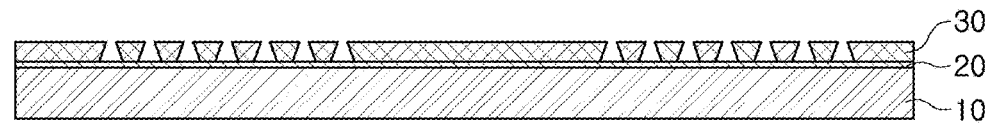

Thereafter, referring to FIG. 4C, the photoresist patterns 30 may be formed on the metal seed layer 20.

The photoresist patterns 30 may be formed as a negative type photoresist.

If the negative type photoresist is used, the conductive member 40 having a trapezoidal shape may be obtained.

The photoresist patterns 30 may be formed by removing a region that is to be plated after being coated on the metal seed layer 20.

Figure 4D:
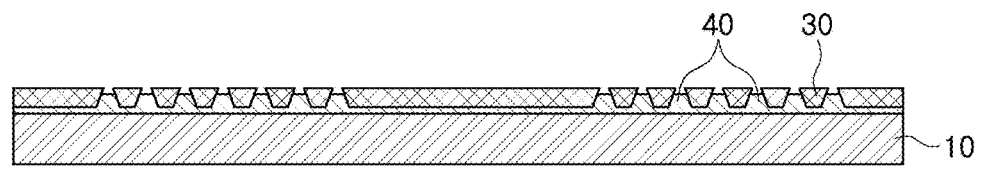

Thereafter, referring to FIG. 4D, the conductive member 40 may be formed by plating metal on the surface of the metal seed layer 20 exposed between the photoresist patterns 30.

The metal may include at least one of gold, silver, platinum, copper, nickel, and palladium, or alloys thereof.

The plating may be performed by electroplating.

Figure 4E:
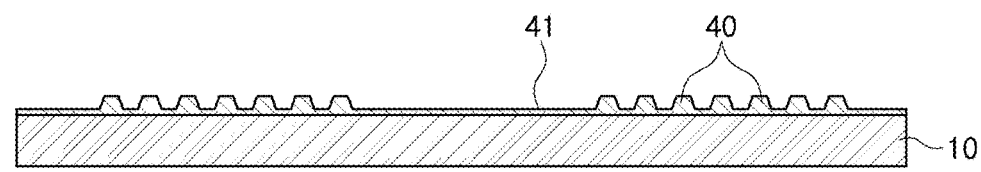

Thereafter, referring to FIG. 4E, after removing the photoresist patterns 30, temporary metal patterns 40 and 41 may be exposed.

The temporary metal patterns 40 and 41 may include the conductive member 40 and the metal seed layer 41.

Figure 4F:
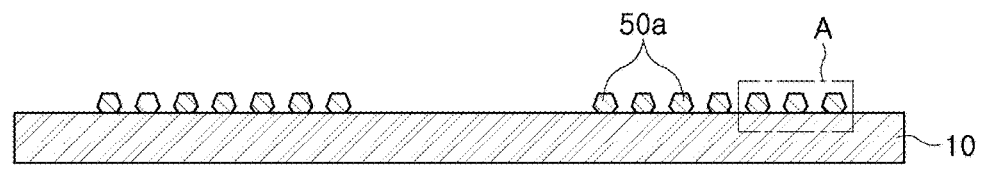

Thereafter, referring to FIG. 4F, the coil patterns 50a may be formed by etching the temporary metal patterns 40 and 41.

The coil patterns 50a may be formed by wet etching the temporary metal patterns 40 and 41 using hydrogen peroxide and sulfuric acid.

When such a plating process may be excessively performed, since coil patterns may be in contact with each other or a minimum spaced distance therebetween may not be secured, wet etching may be performed.

Such wet etching may secure a minimum spaced distance between the coil patterns 50a, and may prevent short circuit that occurs between the coil patterns 50a.

A cross section of the coil pattern 50a may have an undercut in a lower portion thereof due to wet etching.

The cross section of the coil pattern 50a may satisfy a shape that at least one region among inner regions located between upper and lower cross sections is greater than widths of the upper and lower cross sections.

If the one region is greater than the widths of the upper and lower cross sections in the coil pattern 50a, the volume of the coil pattern 50a may be increased, and inductance and resistance characteristics of the thin film type coil component 100 may be improved.

A width of an upper cross section of the coil pattern 50a may be smaller than a width of a lower cross section thereof, and thus, parasitic capacitance that occurs between coil patterns may be reduced, thereby reducing an electrical loss of the thin film type coil component 100.

Therefore, the cross section of the coil pattern 50a may satisfy the shape that the at least one region among inner regions located between upper and lower cross sections is greater than the widths of the upper and lower cross sections, thereby reducing parasitic capacitance and improving the inductance and resistance characteristics.

As set forth above, according to exemplary embodiments, a thin film type coil component may reduce parasitic capacitance that occurs between coil patterns and improve inductance and resistance characteristics.

The cross section of the coil pattern 50a may be H1>H2 when a height from the upper cross section of the coil pattern 50a to the one region is H1 and a height from the lower cross section thereof to the one region is H2.

The one region of the coil pattern 50a may be disposed at a position where an entire thickness H of coil patterns is separated into H1 and H2.

The thin film type coil component according to an exemplary embodiment may include coil patterns having a double trapezoidal cross section shape having an undercut, and thus parasitic capacitance that occurs between the coil patterns may be reduced, thereby reducing electrical loss of the thin film type coil component, and the volume of the coil patterns may be increased, thereby improving inductance and resistance characteristics.

While exemplary embodiments have been shown and described above, it will be apparent to those skilled in the art that modifications and variations could be made without departing from the scope in the present disclosure as defined by the appended claims.

What is claimed is:

1. A thin film type coil component comprising:
a substrate; and
a coil including a plurality of coil patterns disposed on the substrate,
wherein a cross-section of each coil pattern has a shape such that a width of at least one region among inner regions located between upper and lower cross sections is greater than widths of the upper and lower cross sections,
wherein the width of the upper cross section is smaller than the width of the lower cross section, and
wherein the upper and lower cross sections correspond to an uppermost surface and lowermost surface, respectively, of each coil pattern.

2. The thin film type coil component of claim 1, wherein the cross section of each coil pattern satisfies H1>H2, in which H1 is a height from the upper cross section of the coil pattern to the at least one region and H2 is a height from the lower cross section thereof to the at least one region.

3. The thin film type coil component of claim 1, wherein an interval between adjacent coil patterns is in the range from about 0.15 to about 0.45 times the width of the at least one region.

4. The thin film type coil component of claim 1, wherein the plurality of coil patterns are made of at least one of gold, silver, platinum, copper, nickel, and palladium or alloys thereof.

5. The thin film type coil component of claim 1, wherein the substrate is a magnetic substrate.

6. The thin film type coil component of claim 1, further comprising: an insulating layer provided on the substrate.

7. The thin film type coil component of claim 6, wherein the plurality of coil patterns are provided in the insulating layer.

8. The thin film type coil component of claim 1, wherein the cross section of each coil pattern has a double trapezoidal shape in which an undercut is formed in the lower cross section.

9. The thin film type coil component of claim 1, wherein the upper cross section is substantially parallel to the lower cross section.

* * * * *